United States Patent
Kobayakawa

(10) Patent No.: US 7,537,944 B2
(45) Date of Patent: May 26, 2009

(54) METHOD FOR MANUFACTURING P-TYPE GROUP III NITRIDE SEMICONDUCTOR, AND GROUP III NITRIDE SEMICONDUCTOR LIGHT-EMITTING DEVICE

(75) Inventor: Masato Kobayakawa, Chiba (JP)

(73) Assignee: Showa Denko K.K., Tokyo (JP)

( * ) Notice: Subject to any disclaimer, the term of this patent is extended or adjusted under 35 U.S.C. 154(b) by 442 days.

(21) Appl. No.: 10/570,627

(22) PCT Filed: Nov. 4, 2004

(86) PCT No.: PCT/JP2004/016699

§ 371 (c)(1),
(2), (4) Date: Mar. 3, 2006

(87) PCT Pub. No.: WO2005/043582

PCT Pub. Date: May 12, 2005

(65) Prior Publication Data

US 2007/0090369 A1    Apr. 26, 2007

Related U.S. Application Data

(60) Provisional application No. 60/519,636, filed on Nov. 14, 2003.

(30) Foreign Application Priority Data

Nov. 4, 2003    (JP)    ............................. 2003-374478

(51) Int. Cl.
*H01L 21/00*    (2006.01)

(52) U.S. Cl. .................... 438/22; 438/48; 257/E21.097
(58) Field of Classification Search .................. 438/22, 438/31, 46, 48, 481; 257/E21.097
See application file for complete search history.

(56) References Cited

U.S. PATENT DOCUMENTS

| 5,306,662 A | 4/1994 | Nakamura et al. |
| 7,056,755 B1 * | 6/2006 | Kamei et al. .................. 438/45 |
| 2005/0127391 A1 | 6/2005 | Yanamoto |

FOREIGN PATENT DOCUMENTS

| JP | 5-183189 A | 7/1993 |
| JP | 2001-176823 A | 6/2001 |
| JP | 2003-273473 A | 9/2003 |
| JP | 2004-327655 A | 11/2004 |

\* cited by examiner

*Primary Examiner*—Hoai v Pham
(74) *Attorney, Agent, or Firm*—Sughrue Mion, PLLC

(57) ABSTRACT

An object of the present invention is to provide an efficient method for manufacturing a p-type group III nitride semiconductor that has adequate carrier concentration and a surface with a low occurrence of crystal damage. The inventive method for manufacturing a p-type group III nitride semiconductor comprises: (a) growing a group III nitride semiconductor containing a p-type dopant at 1000° C. or higher in an atmosphere containing $H_2$ gas and/or $NH_3$ gas; and (b) after the growth of the group III nitride semiconductor, substituting the $H_2$ gas and $NH_3$ gas with an inert gas at a temperature higher than 800° C. while reducing the temperature.

4 Claims, 1 Drawing Sheet

METHOD FOR MANUFACTURING P-TYPE GROUP III NITRIDE SEMICONDUCTOR, AND GROUP III NITRIDE SEMICONDUCTOR LIGHT-EMITTING DEVICE

CROSS REFERENCE TO RELATED APPLICATION

This application is an application filed under 35 U.S.C. §111(a) claiming benefit pursuant to 35 U.S.C. §119(e)(1) of the filing date of the Provisional Application No. 60/519,636 filed on Nov. 14, 2003, pursuant to 35 U.S.C. §111(b).

TECHNICAL FIELD

The present invention relates to a method for manufacturing a p-type group III nitride semiconductor and to a group III nitride semiconductor light-emitting device using the same and, particularly, relates to a method for manufacturing a p-type group III nitride semiconductor that is formed in layers on the surface of a substrate and that has an adequate carrier concentration and a surface with a low occurrence of crystal damage.

BACKGROUND ART

Group III nitride semiconductor materials have recently garnered attention as semiconductor materials used in light-emitting devices for emitting short-wavelength light. A group III nitride semiconductor is generally formed in layers by metal organic chemical vapor deposition (MOCVD), molecular beam epitaxy (MBE), hydride vapor-phase epitaxy (HVPE), or the like using sapphire crystals and other types of oxide crystals, as well as group III-V compound semiconductor crystals, as substrates.

It has been difficult to form a p-type semiconductor that has an adequate carrier concentration from a group III nitride semiconductor. However, it has been discovered that a p-type semiconductor that has an adequate carrier concentration can be obtained by a method whereby gallium nitride (GaN) doped with Mg is irradiated with a low-speed electron beam (see JP (Kokai) No. 2-257679); a method whereby gallium nitride doped in the same manner with Mg is heat-treated in a hydrogen-free atmosphere (see JP (Kokai) No. 5-183189); and by other methods.

The mechanism whereby an adequate carrier concentration is obtained is said to involve activating a hydrogen-passivated p-type dopant in a semiconductor by dehydrogenating the dopant by the abovementioned methods. Metal organic chemical vapor deposition (MOCVD) is generally used for growing a group III nitride semiconductor having good crystallinity. However, the hydrogen gas used as the carrier gas for transporting the starting material compound onto the substrate, or the hydrogen molecules or the radical or atomic hydrogen generated by the decomposition of the ammonia ($NH_3$) used as the group V starting material, is present in a high concentration in the growth apparatus for growing crystals in the MOCVD method. This hydrogen is incorporated into the crystal during growth of the crystal layer of the group III nitride semiconductor and forms a bond during cooling from the growth temperature of the crystal layer with the p-type dopant used to dope the crystal. The p-type dopant that is passivated by hydrogen in this manner is not active and does not create a positive hole. However, by irradiating this crystal layer with an electron beam and performing a heat treatment thereon, the bond between the p-type dopant and hydrogen in the crystal is broken, and it becomes possible to expel the hydrogen from the crystal and to activate the p-type dopant.

However, the step for removing the group III nitride semiconductor from the growth apparatus and performing post-processing is complex in the abovementioned method, and the cost is high. This method also has drawbacks in that the crystallinity is reduced by the heat treatment because nitrogen is desorbed at the same time as dehydrogenation is performed by the heat treatment, and that the luminous intensity is low in the light-emitting device created using this method.

It is also reported that an adequate carrier concentration is obtained by substituting the $H_2$ gas and $NH_3$ gas with an inert gas and performing cooling when the group III nitride semiconductor is cooled to room temperature after growth (see JP (Kokai) No. 8-125222). However, nitrogen substitution is performed in a vacuum in this method, nitrogen is desorbed from the crystal, perhaps due to the vacuum state, and crystallinity is reduced. Substituting with an inert gas without going through the vacuum state has also been proposed (see JP (Kokai) No. 9-129929). However, substitution with an inert gas is performed at 1100° C. in this method, which is the growth temperature of the nitride semiconductor, so nitrogen is desorbed from the crystal, and crystallinity declines. Two to three hours are also required to reach room temperature after the substitution with an inert gas in this method.

DISCLOSURE OF INVENTION

The present invention was developed in order to overcome the abovementioned drawbacks of the prior art, and an object of the present invention is to provide a method for manufacturing a p-type group III nitride semiconductor that has adequate carrier concentration and a surface with a low occurrence of crystal damage.

The present invention provides the items described below.

(1) A method for manufacturing a p-type group III nitride semiconductor comprising:

(a) growing a group III nitride semiconductor containing a p-type dopant at a temperature of 1000° C. or higher in an atmosphere containing $H_2$ gas and/or $NH_3$ gas; and (b) after the growth of the group III nitride semiconductor, substituting the $H_2$ gas and $NH_3$ gas with an inert gas at the temperature higher than 800° C. while reducing the temperature.

(2) The method for manufacturing a p-type group III nitride semiconductor according to (1), wherein the substitution with the inert gas is carried out after the temperature is reduced by 50° C. or more from the temperature maintained during the growth of the group III nitride semiconductor.

(3) The method for manufacturing a p-type group III nitride semiconductor according to (1) or (2), wherein the substitution with the inert gas is carried out at a temperature of 900° C. or more.

(4) The method for manufacturing a p-type group III nitride semiconductor according to any one of (1) through (3), wherein the temperature during growth of the group III nitride semiconductor is 1050° C. or more, and the substitution with the inert gas is carried out at 1000° C. or more.

(5) The method for manufacturing a p-type group III nitride semiconductor according to any one of (1) through (4), wherein the group III nitride is represented by the formula $Al_xIn_yGa_{1-x-y}$ (wherein x=0 to 0.5 and y=0 to 0.1).

(6) The method for manufacturing a p-type group III nitride semiconductor according to any one of (1) through (5), wherein the p-type group III nitride semiconductor contains magnesium as the p-type dopant.

(7) A group III nitride semiconductor light-emitting device comprising at least an n-type semiconductor layer, a light-emitting layer, and a p-type semiconductor layer of a group III nitride laminated on a substrate in this order, and having a negative electrode and a positive electrode provided in contact with the n-type semiconductor layer and the p-type semiconductor layer, respectively; wherein the p-type semiconductor layer is manufactured by the manufacturing method according to any one of (1) through (6).

(8) A light-emitting diode comprising the group III nitride semiconductor light-emitting device according to (7).

(9) A laser diode comprising the group III nitride semiconductor light-emitting device according to (7).

By the present invention, a p-type group III nitride semiconductor having a p-type carrier concentration sufficient to enable its use as a semiconductor device can be manufactured without deteriorating the morphology of the top surface of the group III nitride semiconductor layer and without damaging the crystallinity of the top surface. The method of the present invention also has fewer steps and better productivity in comparison with the activation annealing by the conventional method because the material is converted to the p-type by a treatment carried out after growth has been completed in the growth apparatus.

BEST MODE FOR CARRYING OUT THE INVENTION

Figure 1:
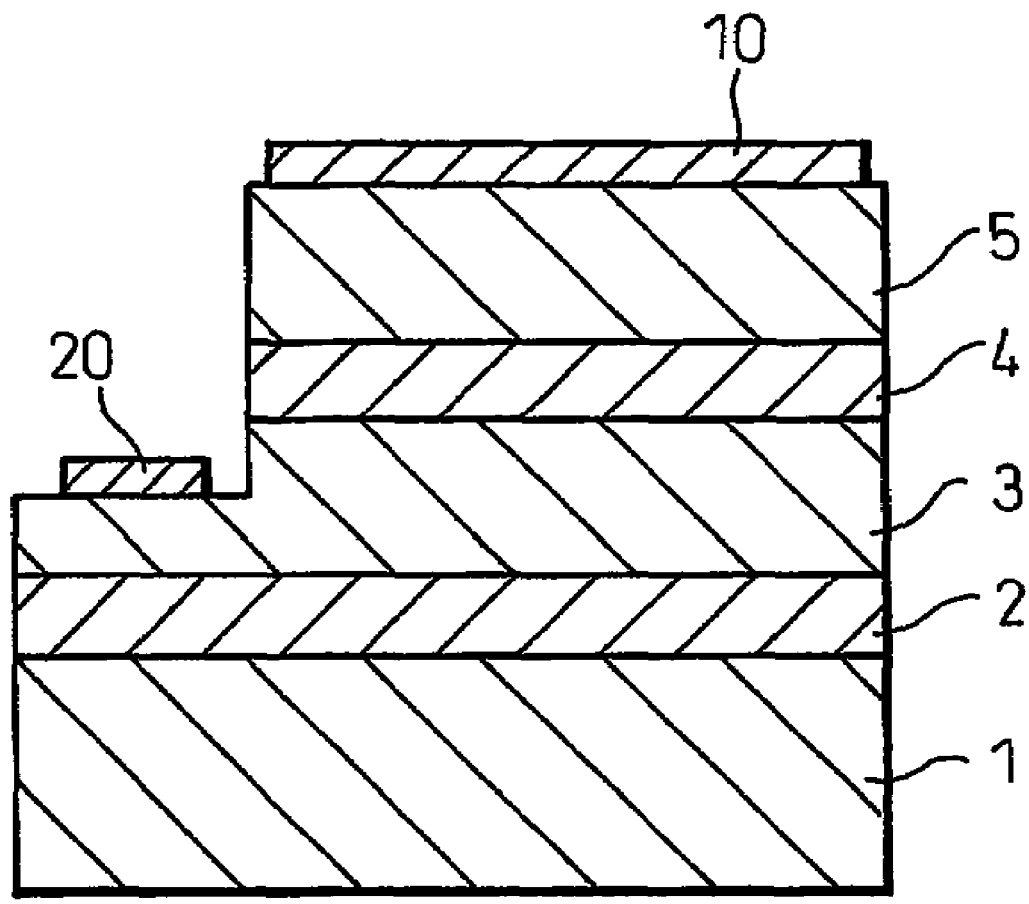
FIG. 1 is a schematic view of the group III nitride semiconductor light-emitting device obtained using the method for manufacturing a p-type group III nitride semiconductor according to the present invention.

The group III nitride semiconductor in the p-type group III nitride semiconductor to which the manufacturing method of the present invention can be applied includes GaN as well as InN, AlN, and other binary mixed crystals; InGaN, AlGaN, and other ternary mixed crystals; InAlGaN and other quaternary mixed crystals; and all other conventionally known group III nitride semiconductors. Also included in the group III nitride semiconductor of the present invention are GaPN, GaNAs, and other tertiary mixed crystals containing group V elements other than nitrogen; InGaPN, InGaAsN, AlGaPN, AlGaAsN, and other quaternary mixed crystals containing In or Al; AlInGaPN and AlInGaAsN containing both In and Al, AlGaPAsN and InGaPAsN containing both P and As, or other quinary mixed crystals; and senary mixed crystals such as AlInGaPAsN containing all of these elements.

The present invention is particularly suitable for binary mixed crystals such as GaN, InN, and AlN; ternary mixed crystals such as InGaN and AlGaN; quaternary mixed crystals such as InAlGaN; and other group III nitride semiconductors containing solely N as a group V element. These crystals are comparatively easy to manufacture and have little danger of decomposition among the abovementioned substances. When the group III nitride semiconductor is represented by the general formula: $Al_xIn_yGa_{1-x-y}$, x is preferably in the range of 0 to 0.5 and y is preferably in the range of 0 to 0.1.

Mg, Ca, Zn, Cd, Hg, and the like, which are reported or expected to exhibit p-type conductivity when used to dope a group III nitride semiconductor, are also included as p-type dopants that can be used in the present invention. Mg, which has a high rate of activation by heat treatment among these elements, is particularly preferred as a p-type dopant. The dopant content is preferably $1\times10^{18}$ to $1\times10^{21}$ cm$^{-3}$. Although conversion to p-type may occur with a lower dopant content than the above content, adequate contact resistance is not obtained when a semiconductor device is formed. A dopant content of more than $1\times10^{21}$ cm$^{-3}$ is also not preferred, because crystallinity is adversely affected. $1\times10^{19}$ to $1\times10^{20}$ cm$^{-3}$ is more preferred.

The method for growing the p-type group III nitride semiconductor to which the present invention is applied is not particularly limited. It is possible to apply MOCVD (metal organic chemical vapor deposition), HVPE (hydride vapor-phase epitaxy), MBE (molecular beam epitaxy), and all other methods that are known to grow a group III nitride semiconductor. The preferred growth method is MOCVD from the perspective of mass production and the ability to control film thickness.

In the MOCVD method, hydrogen ($H_2$) or nitrogen ($N_2$) is used as the carrier gas, trimethyl gallium (TMG) or triethyl gallium (TEG) is used as the Ga source that is the group III starting material, trimethyl aluminum (TMA) or triethyl aluminum (TEA) is used as the Al source, trimethyl indium (TMI) or triethyl indium (TEI) is used as the In source, and ammonia ($NH_3$), hydrazine ($N_2H_4$), or the like is used as the nitrogen source. For the p-type dopant, biscyclopentadienyl magnesium (Cp$_2$Mg) or bisethylcyclopentadienyl magnesium (EtCp$_2$Mg), for example, is used as an Mg starting material, and dimethyl zinc ($Zn(CH_3)_2$) is used as a Zn starting material.

The effects of the present invention are significant under conditions in which passivation of the p-type dopant by hydrogen can occur; specifically, when $H_2$ is used as the carrier gas and/or $NH_3$ is used as the nitrogen source. The invention is also effective when $N_2$ or another inert gas is used as the carrier gas if conditions are such that passivation of the p-type dopant by hydrogen can occur.

The growth temperature is preferably kept at 1000° C. or higher to obtain good crystallinity and contact resistance. A temperature of 1050° C. or higher and 1150° C. or less is more preferred.

The $H_2$ and $NH_3$ must be substituted with an inert gas when the layered semiconductor is cooled to room temperature and removed from the growth apparatus after the group III nitride semiconductor containing the p-type dopant is grown. It is critical that substitution with an inert gas be performed directly without going through a vacuum state. If a vacuum state is used, desorption of, nitrogen from the surface of the semiconductor crystal increases and crystallinity is reduced. The desorbed quantity varies according to the degree of reduced pressure, and it is preferred that the product not pass through a pressure of 10 kPa (100 mbar) or less, more preferably 20 kPa (200 mbar) or less, and particularly preferably 40 kPa (400 mbar) or less.

It is also critical that substitution be performed while the substrate temperature is reduced. Desorption of nitrogen from the surface of the semiconductor crystal occurs and crystallinity is reduced when substitution with the inert gas is performed if the temperature maintained during the growth reaction is kept unchanged. Substitution is preferably performed after reducing the temperature to a level at least 50° C. below the temperature during the growth reaction. Lowering the temperature too much is not preferred because an adequate carrier concentration is not obtained. Substitution is preferably performed within 200° C. of the temperature during the growth reaction, more preferably within 150° C. thereof, and particularly preferably within 100° C. thereof. An adequate carrier concentration is not obtained even if substitution is performed at a substrate temperature of 800° C or below. Substitution is preferably performed at a substrate temperature of 900° C. or above. Substitution is preferably performed at 1000° C. or above if the growth temperature is 1050° C. or above.

It is also critical that the temperature decrease rate of the substrate be controlled. Too low a rate of temperature decrease is not preferred, because crystallinity reduction proceeds as a result of nitrogen desorption. The temperature is preferably reduced at 0.5° C./second or faster, more preferably 1.0° C./second or faster, and particularly preferably 2.0° C./second or faster, from the temperature at growth completion.

Nitrogen is preferred as the inert gas, but argon, helium, or the like, or a mixture of these gases may also be used.

The method for manufacturing a p-type group III nitride semiconductor according to the present invention can be used in the manufacture of a semiconductor device in which a p-type group III nitride semiconductor is formed on a substrate as one layer of a multilayer structure that constitutes the semiconductor device. For example, besides the manufacture of a semiconductor light-emitting device such as a light-emitting diode, a laser diode, and the like, this method can also be used in the manufacture of any type of semiconductor device if the semiconductor device being manufactured is one that requires p-type group III nitride semiconductors, such as various types of high-speed transistors, photo devices, and the like, and is particularly suited for use in the manufacture of a semiconductor light-emitting device that requires formation of a pn junction and an electrode having good characteristics.

FIG. 1 is a schematic view of a group III nitride semiconductor light-emitting device manufactured using the method for manufacturing a p-type group III nitride semiconductor according to the present invention. An n-type semiconductor layer 3, light-emitting layer 4, and p-type semiconductor layer 5, which are composed of a group III nitride semiconductor, are layered in order on the substrate 1 via a buffer layer 2 as needed, a negative electrode 20 is provided to the n-type semiconductor layer 3, and a positive electrode 10 is provided to the p-type semiconductor layer 5.

Sapphire, SiC, GaN, AlN, Si, ZnO or another oxide substrate, or any other conventional, known material may be used without limit in the substrate 1. Sapphire is preferred. The buffer layer 2 is provided as needed in order to adjust the lattice mismatch between the substrate and the n-type semiconductor layer 3 formed thereon. A conventional, known buffer layer technique is, used as needed.

The desired composition and structure for the n-type semiconductor layer 3 may be set using a technique that is well known in this technological field. The n-type semiconductor layer is usually composed of a clad layer having greater band gap energy than the light-emitting layer, and a contact layer that yields good ohmic contact with the negative electrode.

A single quantum well structure (SQW), a multiple quantum well structure (MQW), or any other conventional, known composition and structure may also be used without limit for the light-emitting layer 4.

The p-type semiconductor layer 5 is formed by the manufacturing method of the present invention. The desired composition and structure thereof may be set using a technique that is well known in this technological field. In the same manner as the n-type semiconductor layer, the p-type semiconductor layer is usually composed of a clad layer having greater band gap energy than the light-emitting layer, and a contact layer that yields good ohmic contact with the positive electrode.

The negative electrode 20 and the positive electrode 10 are provided to the n-type semiconductor layer 3 (contact layer) and the p-type semiconductor layer 5 (contact layer), respectively, by a common means that is well known in this technological field. Any conventional, known structure may also be used without limit for the structure thereof.

EXAMPLES

The present invention will be described in greater detail hereinafter using examples, but the present invention is not limited by these examples.

Example 1

In the present example, a sample was fabricated by a process in which a GaN layer was formed as a buffer layer, on a sapphire substrate using the MOCVD method, and a GaN layer doped with Mg was laminated thereon at 1100° C. Furthermore, after lamination, the supply of ammonia gas and $H_2$ was stopped at a temperature of 1050° C., nitrogen gas was supplied thereto instead, and the product was cooled, whereby an Mg p-type dopant was put in an activated state. Details thereof are described hereinafter.

The sample with a GaN layer was fabricated using the MOCVD method in the procedure described below. First, the sapphire substrate was inserted into a quartz reactor mounted in the RF coil of an induction heating furnace. The sapphire substrate was placed on a carbon susceptor used for heating. After the substrate had been inserted, a vacuum was formed inside the reactor, the air was removed, nitrogen gas was circulated therein, and the inside of the reactor was purged. After the nitrogen gas had been circulated for ten minutes, the induction heating furnace was activated and the substrate temperature was raised to 1180° C. over a period of ten minutes. With the substrate temperature held at 1180° C., the apparatus was left for ten minutes while hydrogen gas and nitrogen gas were circulated, and thermal cleaning of the substrate surface was performed. While the cleaning was being performed, the hydrogen carrier gas was caused to flow through the duct of a vessel (bubbler) that was connected to the reactor and contained the starting materials trimethyl gallium (TMG) and cyclopentadienyl magnesium ($Cp_2Mg$), and bubbling was begun. The temperature of each bubbler was adjusted to a constant value using a temperature-adjusting thermostat. The vapor of the starting material formed by bubbling was conducted, together with the carrier gas, to a duct leading to an abatement device and was released from the system through the abatement device before the growth the GaN layer was started.

After thermal cleaning was completed, the thermal induction furnace was adjusted, the substrate temperature was lowered to 510° C., the valves of the TMG duct and the ammonia gas duct were switched after ten minutes, TMG and ammonia were fed into the reactor, and a buffer layer composed of GaN was formed on the substrate. The pressure used in the reaction at this time was 20 kPa, the ammonia feed rate was 3 L/minute, the TMG feed rate was 35 cc/minute, and the hydrogen gas feed rate was 8 L/minute. After the buffer layer had been grown for approximately ten minutes, the valve of the TMG duct was switched, the TMG supply was stopped, and growth of the buffer layer was completed.

After the buffer layer was formed, the substrate temperature was raised to 1100° C. Ammonia gas was fed into the reactor in addition to the hydrogen carrier gas so that the buffer layer would not sublime during the temperature increase. After it had been confirmed that the temperature was stable at 1100° C., the valves of the TMG and $Cp_2Mg$ ducts were switched, a gas containing the vapors of these starting materials was fed into the reactor, and a GaN layer doped with Mg was grown on the buffer layer. After the abovementioned GaN layer had been grown for two hours using the conditions described below, the valves of the TMG and $Cp_2Mg$ ducts were switched, the supply of starting materials to the reactor was stopped, and growth was stopped. The conditions were a pressure of 20 kPa, an ammonia feed rate of 3 L/minute, a TMG feed rate of 35 cc/minute, a hydrogen gas feed rate of 8 L/minute, and a $Cp_2Mg$ feed rate of 240 cc/minute.

After growth of the GaN layer was completed, the thermal induction furnace was controlled so as to decrease the substrate temperature to room temperature over a period of 20 minutes. The atmosphere inside the reactor was composed of ammonia and hydrogen in the same manner as during growth in order to minimize N desorption from the crystal surface, and after confirming that the substrate temperature had reached 1050° C., the supply of ammonia and hydrogen was stopped, and the supply was changed to that of nitrogen gas. The substrate temperature was then reduced to room temperature while feeding nitrogen gas at a rate of 30 L/minute, and the sample was taken out into the atmosphere.

By the above process, a sample was fabricated in which a GaN buffer layer having a film thickness of 20 nm was formed on a sapphire substrate, and a GaN layer doped with $1 \times 10^{20}$ $cm^{-3}$ of Mg and having a thickness of 2 μm was formed thereon.

The carrier concentration of the sample Mg-doped GaN layer was then measured. The carrier concentration was measured as described below using a Hall effect measurement in the usual van der Pauw method. A sample cut into a square measuring 7 mm on a side was immersed for ten minutes in acetone in a beaker subjected to ultrasonic waves, then boiled in hydrochloric acid for ten minutes, and rinsed in running water for three minutes. Circular electrodes with a diameter of 0.5 mm composed of Ni with a film thickness of 3000 Å were then formed at the four corners of the sample by vapor deposition using a metal mask. The sample was annealed for ten minutes at 450° C. in an argon atmosphere in order to form an ohmic contact between the electrode and the sample. The Hall-effect measurement was performed by applying a current of 10 μA to the abovementioned sample in a 3000-G magnetic field. The contact characteristics of the electrodes were ohmic, and it was confirmed that an accurate measurement had been performed. It was apparent as a result of this measurement that the GaN layer doped with Mg was p-type and that it had a carrier concentration of $2 \times 10^{17}$ $cm^{-3}$. The top surface of the GaN layer was also observed using an Atomic Force Microscope (AFM). As a result, it was observed that the surface had good morphology and had no traces of having undergone sublimation/decomposition as a result of the fact that the ammonia and hydrogen were stopped at high temperature. The surface roughness (Ra) calculated from the AFM observation was 20 to 30 Å.

Comparative Example 1

A GaN layer was formed as a buffer layer on a sapphire substrate, and a GaN layer doped with Mg was laminated thereon in the same manner as in Example 1. The operation in which the sample was cooled to room temperature after lamination had been completed was the same as in Example 1 except that the supply of ammonia and hydrogen was stopped and switched to nitrogen gas after confirming that the substrate had reached a temperature of 800° C.

When the carrier concentration was then measured by the same method as in Example 1, it was found that the carrier concentration, of $7 \times 10^{15}$ $cm^{-3}$, was small compared to Example 1.

Comparative Example 2

A GaN layer was formed as a buffer layer on a sapphire substrate, and a GaN layer doped with Mg was laminated thereon in the same manner as in Example 1. Except that the supply of ammonia and hydrogen was stopped and changed to nitrogen gas immediately after growth was completed, the substrate temperature was reduced to room temperature and the sample was taken out into the atmosphere in the same manner as in Example 1.

When the carrier concentration was then measured by the same method as in Example 1, it was found that the GaN layer was p-type and that its carrier concentration was $6 \times 10^{17}$ $cm^{-3}$. However, an examination of the top surface of the GaN layer under an AFM indicated that traces of what was believed to be sublimation/decomposition could be seen on the surface of the GaN layer. The Ra calculated from AFM observations was 200 Å.

Test Example 1

The sample of Example 1 and the sample of Comparative Example 1 were heat-treated by the method described in aforementioned JP (Kokai) No. 5-183189, and it was confirmed that further heat treatment was not needed for the sample obtained in Example 1 according to the present invention, but further heat treatment was needed for the sample obtained in Comparative Example 1. Details of this operation are described hereinafter.

A heat treatment furnace was used for heat treatment. The heat treatment furnace is an infrared ray furnace designed such that a carbon susceptor can be mounted inside a quartz reactor tube designed to allow feeding of various gases used in heat treatment through a gas introduction port.

The heat treatment furnace is provided with a vacuum flange and a vacuum pump connected to a gas exhaust port, and a vacuum can be created inside the reactor tube. A thermocouple for monitoring the temperature can be inserted into the carbon susceptor, the power of the infrared ray heater can be controlled based on the signal from the thermocouple, and the temperature of the sample can be controlled. The gas expelled by the pump is released to the outside air through water, and the ammonia flowing through the inside of the heat treatment furnace is dissolved in water and not released to the outside.

The samples were heat-treated using the abovementioned heat treatment furnace according to the sequence of operations described below. The susceptor was first removed to the outside, the sample was placed thereon and inserted back into the reactor tube, and the vacuum flange was fixed in place. A vacuum was then created inside the reactor tube by the vacuum pump and the tube was purged with nitrogen gas, which is the gas atmosphere used in heat treatment. After repeating this operation three times, the inside of the reactor tube was returned to atmospheric pressure and the aforementioned atmosphere gas was caused to flow into the reactor tube for five minutes at a flow rate of 0.5 cc/minute. After the atmosphere gas had flowed for five minutes, an electrical current was applied to the infrared ray heater, and the sample was heated. With the atmosphere gas still being fed at the abovementioned rate, the sample was first heated to a temperature of 900° C. over a period of one minute. After maintaining a temperature of 900° C. in this state for one minute, the current to the infrared ray heater was set to zero and heating of the sample was stopped. The temperature of the sample was reduced in this state to room temperature over a period of 20 minutes. After confirming that the temperature of the susceptor was equal to room temperature, the vacuum flange was released, the susceptor was brought out, and the sample was recovered.

The concentration of carriers in the Mg-doped GaN layer of the heat-treated sample was then measured by the method of Example 1.

The carrier concentration of the sample in Example 1 was substantially unchanged, being $3\times10^{17}$ cm$^{-3}$, and the carrier concentration of the sample in Comparative Example 1 was improved, being $1\times10^{17}$ cm$^{-3}$.

Example 2

The group III nitride semiconductor light-emitting device depicted in FIG. 1 was fabricated using the p-type group III nitride semiconductor obtained by the manufacturing method of the present invention.

An n-type semiconductor layer 3, a light-emitting layer 4, and a p-type semiconductor layer 5 were grown in this order by a common vacuum MOCVD method widely known in the art via a buffer layer 2 composed of AlN on a substrate 1 composed of a sapphire c face ((0001) crystal face), and a layered structure was fabricated. An undoped GaN layer (foundation layer: layer thickness=2 μm) and a Ge-doped n-type GaN layer (n contact layer: layer thickness=2 μm, carrier concentration=$1\times10^{19}$ cm$^{-3}$) were laminated in the same order as the n-type semiconductor layer 3. The light-emitting layer 4 had a multiple quantum structure composed of a six-layer Ge-doped GaN barrier layer (layer thickness=14.0 nm, carrier concentration=$1\times10^{18}$ cm$^{-3}$) and a five-layer undoped $In_{0.20}Ga_{0.80}N$ well layer (layer thickness=2.5 nm). The p-type semiconductor layer 5 was composed of a Mg-doped p-type $Al_{0.07}Ga_{0.93}N$ layer (p clad layer: thickness=10 nm) and a Mg-doped p-type $Al_{0.02}Ga_{0.98}N$ layer (p contact layer: thickness=150 nm) layered in the same order.

Also, the Mg-doped $Al_{0.02}Ga_{0.98}N$ contact layer was fabricated according to the process described below.

(1) After growth of the Mg-doped $Al_{0.07}Ga_{0.93}N$ clad layer was completed, the pressure inside the growth reactor was set to $4\times10^4$ pascals (Pa).

(2) Vapor-phase growth of an Mg-doped AlGaN layer was started at 1100° C. using trimethyl gallium, trimethyl aluminum, and ammonia as starting materials, and biscyclopentadienyl magnesium as a Mg doping source. Hydrogen was used as the carrier gas during growth.

(3) Trimethyl gallium, trimethyl aluminum, ammonia, and biscyclopentadienyl magnesium were continuously fed into the growth reactor for four hours, and a Mg-doped $Al_{0.02}Ga_{0.98}N$ layer was grown in a thickness of 150 nm.

(4) Feeding of trimethyl gallium, trimethyl aluminum, and biscyclopentamagnesium into the growth reactor was stopped, and growth of the Mg-doped AlGaN layer was stopped.

(5) After the vapor-phase growth of the p-type contact layer composed of the Mg-doped $Al_{0.02}Ga_{0.98}N$ layer was completed, the electrical current to the heater was immediately stopped, the carrier gas was switched from hydrogen to nitrogen 20 seconds later, and the ammonia was cut off. The temperature of the reactor at this time was 1050° C.

(6) After having been cooled to room temperature in this state, the layered structure was taken out of the growth reactor.

The concentration of magnesium and hydrogen atoms in the p contact layer of the layered structure thus obtained was determined by a Secondary Ion Mass Spectrometer (SIMS) analysis method. Mg atoms were in a concentration of $7\times10^{19}$ cm$^{-3}$ and were distributed in a substantially constant concentration, in the depth direction, from the surface. Hydrogen atoms were present in a substantially constant concentration of $6\times10^{19}$ cm$^{-3}$. Also, the carrier concentration, which was measured by the same method as in Example 1, was $3\times10^{17}$ cm$^{-3}$. The resistance was estimated to be approximately 150 Ωcm from measurement by a TLM method.

A light-emitting device (LED) was fabricated using the layered structure provided with the p-type group III nitride semiconductor layer. First, usual dry etching was performed in the area in which the negative electrode 20 was formed, and the surface of the Ge-doped GaN layer (n contact layer) was exposed solely in that area. A negative electrode 20 composed of layered titanium (Ti)/aluminum (Al) was formed on the exposed portion of the surface. The metal film in contact with the surface of the n contact layer 3 was a titanium film.

A reflecting positive electrode 10 composed of layered platinum (Pt) film/rhodium (Rh) film/gold (Au) film and endowed with the ability whereby light emitted from the light-emitting layer was reflected towards the sapphire substrate was formed substantially over the entire remaining surface of the p contact layer. The metal film in contact with the surface of the p contact layer 5 was a platinum film.

After the negative electrode 20 and the positive electrode 10 were formed, the back surface of the sapphire substrate 1 was ground using an abrasive grain of diamond particles, and a mirror finish was ultimately obtained. The layered structure thus obtained was then cut and separated into individual square-shaped light-emitting devices measuring 350 μm on a side.

The negative electrode and the positive electrode of the light-emitting device thus obtained were then attached to a mount and made into flip-type chip. The chip electrodes were subjected to a heat of approximately 300° C. at that time. The chip was then placed on a lead frame and connected to the lead frame by gold (Au) wire.

An electrical current was caused to flow in the forward direction between the negative electrode 20 and the positive electrode 10 of the LED chip thus obtained, and the electrical characteristics and light-emitting characteristics thereof were evaluated. The forward drive voltage (Vf) was 3.0 V when the forward current was set to 20 mA, and the light output measured by a common integrating sphere was 10 mW. The reverse voltage (Vr) was 20 V or higher when the reverse current was set to 10 μA. The wavelength of the light emitted to the outside through the sapphire substrate was 455 nm. Approximately 10,000 LED chips, not counting products defective in appearance, were obtained from a wafer 5.1 cm (2 inches) in diameter, and uniform characteristics such as those described above were observed.

Example 3

A light-emitting device was fabricated in the same manner as Example 2, except that a translucent positive electrode having the ability to transmit light from the blue to ultraviolet range and formed by layering a nickel (Ni) film/gold (Au) film was used as the positive electrode and the metal film in contact with the p contact layer 5 was constituted by a nickel film.

The sapphire surface of the light-emitting device thus obtained was then attached to a mount, the negative electrode and positive electrode were connected to a lead frame by gold wires, and the product was evaluated in the same manner as in Example 2.

The forward drive voltage (Vf) was 3.0 V when the forward current was set to 20 mA, the light output measured by a common integrating sphere was 6 mW, and the wavelength of the emitted light was 455 nm. The reverse voltage (Vr) was 20 V or higher when the reverse current was set to 10 μA. Approximately 10,000 LED chips, not counting products defective in appearance, were obtained from a wafer 5.1 cm (2 inches) in diameter, and uniform characteristics such as those described above were observed.

Example 4

A light-emitting device was fabricated in the same manner as Example 2, except that a translucent positive electrode having the ability to transmit light from the blue to ultraviolet range and formed by layering a cobalt (Co) film/gold (Au) film was used as the positive electrode and the metal film in contact with the p contact layer 5 was constituted by a cobalt film.

The light-emitting device thus obtained was evaluated in the same manner as in Example 3.

The forward drive voltage (Vf) was 3.0 V when the forward current was set to 20 mA, the light output measured by a common integrating sphere was 6 mW, and the wavelength of the emitted light was 455 nm. The reverse voltage (Vr) was 20 V or higher when the reverse current was set to 10 μA. Approximately 10,000 LED chips, not counting products defective in appearance, were obtained from a wafer 5.1 cm (2 inches) in diameter, and uniform characteristics such as those described above were observed.

Example 5

A light-emitting device was fabricated in the same manner as Example 2, except that a translucent positive electrode having the ability to transmit light from the blue to ultraviolet range and formed by layering a platinum (Pt) film/gold (Au) film was used as the positive electrode and the metal film in contact with the p contact layer 5 was constituted by a platinum film.

The light-emitting device thus obtained was evaluated in the same manner as in Example 3.

The forward drive voltage (Vf) was 3.0 V when the forward current was set to 20 mA, the light output measured by a common integrating sphere was 6 mW, and the wavelength of the emitted light was 455 nm. The reverse voltage (Vr) was 20 V or higher when the reverse current was set to 10 μA. Approximately 10,000 LED chips, not counting products defective in appearance, were obtained from a wafer 5.1 cm (2 inches) in diameter, and uniform characteristics such as those described above were observed.

As described above, it was verified in every example that good contact performance was present and that the effects of the present invention were obtained regardless of the composition and structure of the positive electrode.

INDUSTRIAL APPLICABILITY

The method of manufacturing a p-type group III nitride semiconductor provided by the present invention has excellent productivity without the need for the conventional post-activation processing. Consequently, the manufacturing method of the present invention is extremely useful in the manufacture of a group III nitride semiconductor device.

The invention claimed is:

1. A method for manufacturing a p-type group III nitride semiconductor comprising:
   (a) growing a group III nitride semiconductor containing a p-type dopant at a temperature of 1000° C. or higher in an atmosphere containing $H_2$ gas and/or $NH_3$ gas; and
   (b) after the growth of the group III nitride semiconductor, substituting the $H_2$ gas and $NH_3$ gas with an inert gas at the temperature of 900° C. or more while reducing the temperature at 0.5° C./second or faster without maintaining a constant temperature during reducing the temperature and after the temperature is reduced 50° C. or more from the temperature maintained during the growth of the group III nitride semiconductor.

2. The method for manufacturing a p-type group III nitride semiconductor according to claim 1, wherein the temperature during growth of the group III nitride semiconductor is 1050° C. or more, and the substitution with the inert gas is carried out at 1000° C. or more.

3. The method for manufacturing a p-type group III nitride semiconductor according to claim 1, wherein the group III nitride is represented by the formula $Al_xIn_yGa_{1-x-y}$ (wherein x=0 to 0.5 and y=0 to 0.1).

4. The method for manufacturing a p-type group III nitride semiconductor according to claim 1, wherein the p-type group III nitride semiconductor contains magnesium as the p-type dopant.

* * * * *